(12) United States Patent
Hsieh

(10) Patent No.: US 9,413,350 B1
(45) Date of Patent: Aug. 9, 2016

(54) SWITCHING CIRCUIT FOR POWER CONSUMPTION REDUCTION

(71) Applicant: Fitipower Integrated Technology, Inc., Hsinchu (TW)

(72) Inventor: Chung-Hsiao Hsieh, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 0 days.

(21) Appl. No.: 14/700,855

(22) Filed: Apr. 30, 2015

(30) Foreign Application Priority Data

Feb. 3, 2015 (TW) ............................. 104103632 A

(51) Int. Cl.
*H03K 3/00* (2006.01)
*H03K 17/687* (2006.01)
*H03K 3/012* (2006.01)

(52) U.S. Cl.
CPC .............. *H03K 17/687* (2013.01); *H03K 3/012* (2013.01)

(58) Field of Classification Search
None
See application file for complete search history.

(56) References Cited

U.S. PATENT DOCUMENTS

| | | | | |
|---|---|---|---|---|
| 5,218,239 A | * | 6/1993 | Boomer | H03K 19/00361 326/27 |
| 2006/0158232 A1 | * | 7/2006 | Lenz | G06F 13/4072 327/112 |
| 2010/0244907 A1 | * | 9/2010 | Gagne | H03K 19/0008 327/109 |

* cited by examiner

*Primary Examiner* — Long Nguyen
(74) *Attorney, Agent, or Firm* — ScienBiziP, P.C.

(57) ABSTRACT

A switching circuit includes a first switch, a second switch, and a reservoir capacitor. The first switch includes a first gate, a first source, a first drain, and a first gate-to-source capacitor coupled between the first gate and the first source. The second switch includes a second gate, a second source, a second drain, and a second gate-to-source capacitor coupled between the second gate and the second source. The reservoir capacitor is coupled to both the first gate and the second gate. When the first switch is turned on, the first gate-to-source capacitor is charged by a power voltage source and accumulates charges. When the first switch is turned off, the reservoir capacitor is charged by the charges from the first gate-to-source capacitor. The charges stored in the reservoir can be used to charge the second gate-to-source capacitor.

14 Claims, 3 Drawing Sheets

SWITCHING CIRCUIT FOR POWER CONSUMPTION REDUCTION

CROSS-REFERENCE TO RELATED APPLICATIONS

This application claims priority to Taiwanese Patent Application No. 104103632 filed on Feb. 3, 2015, the contents of which are incorporated by reference herein.

FIELD

The subject matter herein generally relates to a switching circuit which can be used in electronic devices for power consumption reduction.

BACKGROUND

Switching circuits are widely used in electronic devices. In general, a many of switching circuits employ transistors such as meta oxide semiconductor field effect transistors (MOSFET) to function as switches. When the switching circuits are powered on, the transistors may have power consumption more or less.

BRIEF DESCRIPTION OF THE DRAWINGS

Implementations of the present technology will now be described, by way of example only, with reference to the attached figures.

DETAILED DESCRIPTION

Figure 1:
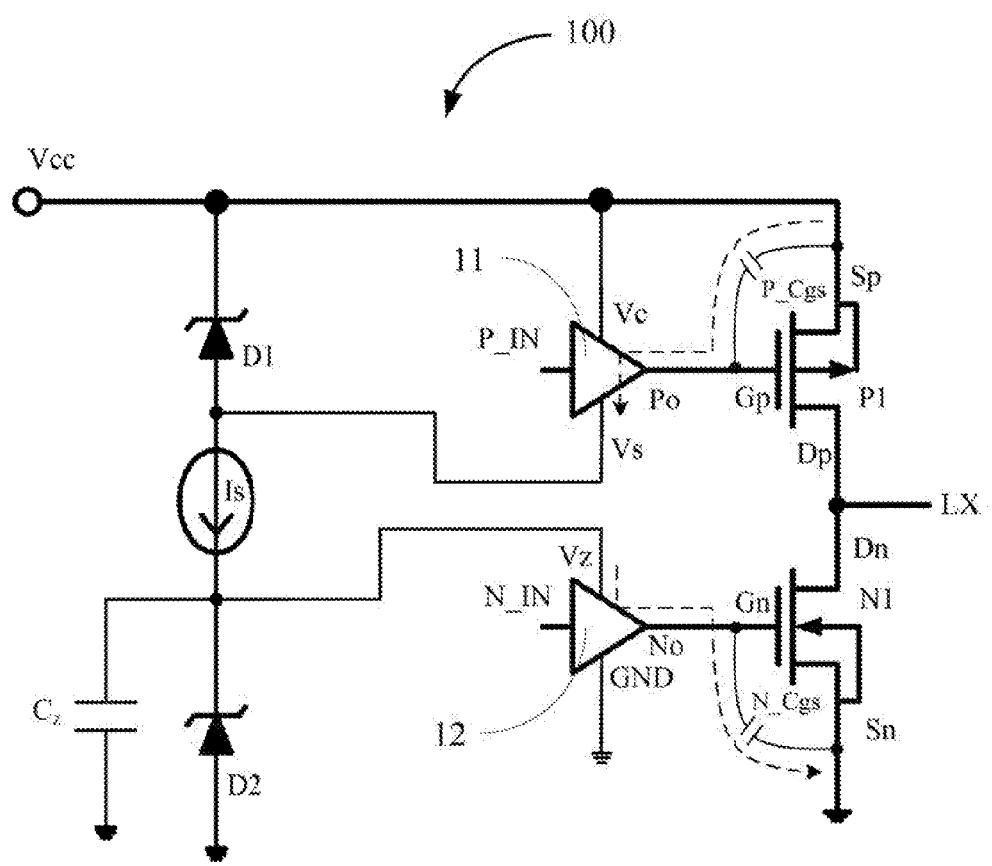
FIG. 1 is a circuit diagram of a switching circuit of the present disclosure according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "comprising", when utilized, means "including, but not necessarily limited to"; it specifically indicates open-ended inclusion or membership in the so-described combination, group, series and the like.

The present disclosure is described in relation to a switching circuit which can be used in electronic devices for power consumption reduction.

FIG. 1 is a circuit diagram of a switching circuit 100 of the present disclosure according to a first embodiment. The switching circuit 100 can include a first switch P1 and a second switch N1. In this embodiment, when one of the first switch P1 and the second switch N1 is turned on, another thereof is turned off. The first switch P1 can include a first gate Gp, a first source Sp, and a first drain Dp. A first gate-to-source capacitor P_Cgs is electrically coupled between the first gate Gp and the first source Sp. The second switch N1 can include a second gate Gn, a second source Sn, and a second drain Dn. A second gate-to-source capacitor N_Cgs is electrically coupled between the second gate Gn and the second source Sn. The first gate-to-source capacitor P_Cgs is a capacitor formed between the first gate Gp and the first source Sp. The second gate-to-source capacitor N_Cgs is a capacitor formed between the second gate Gn and the second source Sn. In at least one embodiment, the first switch P1 is a P type metal oxide semiconductor field effect transistor (P-MOS), and the second switch N1 is an N type metal oxide semiconductor field effect transistor (N-MOS).

The first gate Gp is electrically connected to a reservoir capacitor Cz via a first pre-driver 11. The second gate Gn is electrically connected to the reservoir capacitor Cz. The first pre-driver 11 is electrically coupled between the first switch P1 and the reservoir capacitor Cz. The second pre-driver 12 is electrically coupled between the second switch N1 and the reservoir capacitor Cz. Both the first pre-driver 11 and the second pre-drive 12 are electrically connected to a same end of the reservoir capacitor Cz. In at least one embodiment, each of the first pre-driver 11 and the second pre-driver 12 can be an integrated circuit (IC) for driving the first switch P1 and the second switch N1, respectively. For example, the first pre-driver 11 and the second pre-driver 12 can be one of a family of FLEXMOS™ automotive grade products for driving logic-level MOSFETs. In other embodiments, the each of the first pre-driver 11 and the second pre-driver 12 can be a buffer circuit including a plurality of inverters connected in serial.

The first source Sp is electrically coupled to a power voltage source Vcc. The first drain Dp is electrically coupled to the second source Sn. The second drain Dn is grounded. An output port LX is coupled to both the first drain Dp and the second source Sn. When the first switch P is turned on, the first gate-to-source capacitor P_Cgs is charged by the power voltage source Vcc and accumulates charges therein. When the first switch P1 is turned off, the first gate-to-source capacitor P_Cgs discharges and the charges stored in the first gate-to-source capacitor P_Cgs flow into the reservoir capacitor Cz via the first pre-driver 11. Thus, the reservoir capacitor Cz is charged by the charges from the first gate-to-source capacitor P_Cgs and accumulates charges therein. Then, when the second switch N1 is being turned on, the reservoir capacitor Cz discharges and the charges stored in the reservoir capacitor Cz flow into the second gate-to-source capacitor N_Cgs to charge the second gate-to-source capacitor N_Cgs. In at least one embodiment, the first pre-driver 11 includes a first control terminal P_IN, a power terminal Vc, a current source terminal Vs, and a first output terminal Po. The first control terminal P_IN is configured to receive an external control signal which is configured to control the first switch P1. For example, the external control signal can turn on or turn off the first switch P1. The power terminal Vc is electrically coupled to the power voltage source Vcc. The first output terminal Po is electrically coupled to the first gate Gp of the first switch P1, to transmit the external control signal to the first gate Gp to turn on or turn off the first switch P1.

Further, the switching circuit 100 can further include a current source Is. In order to prevent reverse current, the first pre-driver 11 and the current source Is are interconnected in serial between the first gate Gp and the reservoir capacitor Cz. The current source Is includes a first end electrically coupled to the current source terminal Vs of the first pre-driver 11 and a second end electrically coupled to the reservoir capacitor Cz. In addition, the first end is electrically coupled to the power voltage source Vcc via a first diode D1, and the second end is electrically coupled to a second diode D2 which is grounded. Each of the first diode D1 and the second diode D2 can be a Zener diode having a reverse breakdown voltage (e.g., 5V). The first diode D1 includes an anode coupled to the power voltage source Vcc and a cathode coupled to the first end of the current source Is. The second diode D2 includes an anode coupled to the second end of the current source Is and a cathode which is grounded, to protect the second pre-driver 12. For example, when a voltage output from the current Is is greater than a threshold voltage (e.g., 5V), the second diode D2 is reverse breakdown, to ground the current source Is. Thus, the voltage which is greater than the threshold voltage will not be outputted to the second pre-driver 12 and the second pre-driver 12 is thus protected.

The second pre-driver 12 includes a second control terminal N_IN, a power terminal Vz, a ground terminal GND, and a second output terminal No. The second control terminal N_IN is configured to receive an external control signal for controlling the second switch N1. The power terminal Vz is coupled to both the reservoir capacitor Cz and the current source Is. The second output terminal No is electrically coupled to the second gate Gn of the second switch N1 to transmit the external control signal to the second switch N1 to turn on or turn off the second switch N1.

Figure 2:
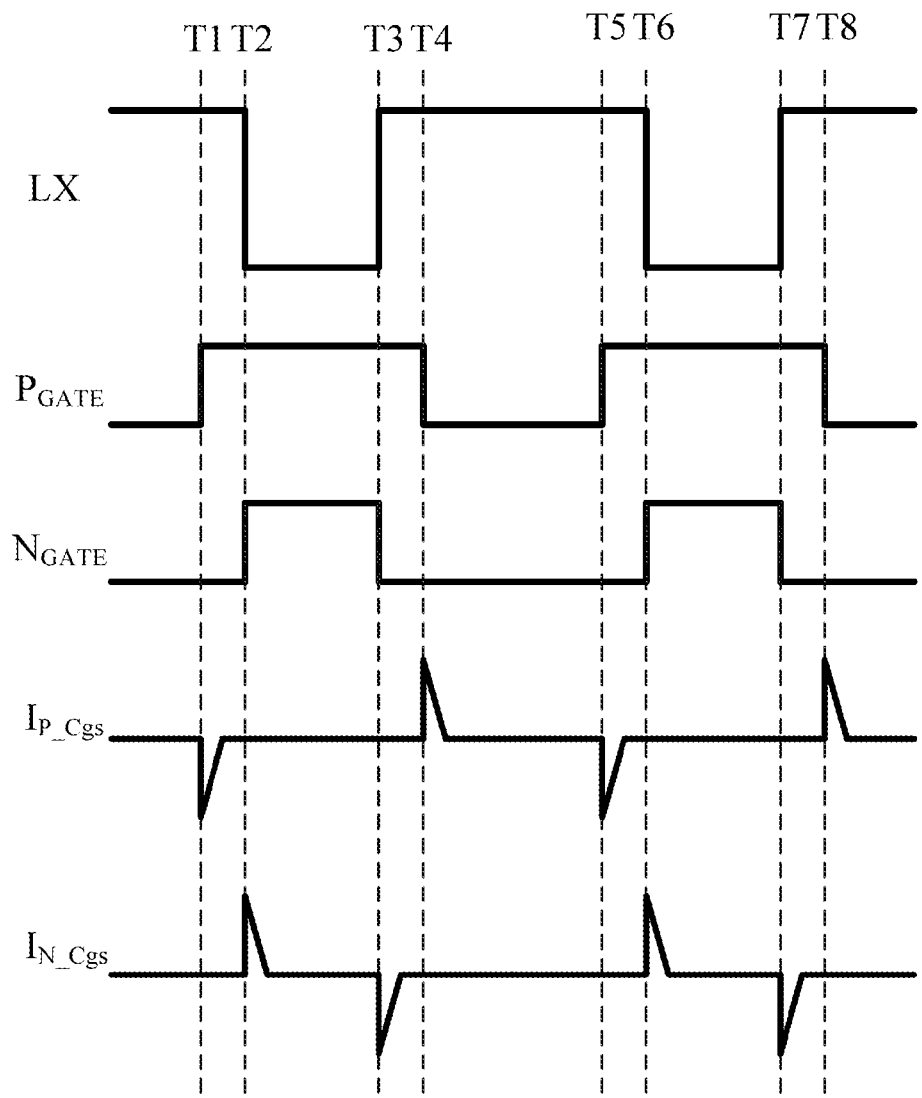
FIG. 2 is a sequence diagram of the switching circuit of FIG. 1.

In use, as shown in FIG. 2, a curve LX represents a waveform of output signals from the output port LX coupled to the first drain Dp and the second source Sn. A curve $P_{Gate}$ represents a waveform of a first control signal for controlling the first switch P1. A curve $N_{Gate}$ represents a waveform of a second control signal for controlling the second switch N1. A curve $I_{p\_Cgs}$ represents a waveform of charges stored in the first gate-to-source capacitor P_Cgs. A curve $I_{N\_Cgs}$ represents a waveform of charges stored in the second gate-to-source capacitor N_Cgs.

At time T1, the first control signal $P_{Gate}$ is raised from a low level to a high level. At this time, the first switch P1 is turned off, and the first gate-to-source capacitor P_Cgs discharges and the charges stored in the first gate-to-source capacitor P_Cgs flow into the reservoir capacitor Cz to charge the reservoir capacitor Cz. Thus, the charges stored in the first gate-to-source capacitor P_Cgs gradually reduces. Further, since the second control signal maintains at a high level, the second switch N1 is still in a turned off state, and the output signal of the output port LX is a high level signal.

At time T1, the second control signal $N_{Gate}$ is raised from a low level to a high level. At this time, the second switch N1 is turned on, and the reservoir capacitor Cz discharges and the charges stored in the reservoir capacitor Cz flow into the second gate-to-source capacitor N_Cgs to charge the second gate-to-source capacitor N_Cgs. Thus, the charges stored in the second gate-to-source capacitor N_Cgs gradually increases. Further, since the second switch N1 is turned on, the output port LX is grounded via the second switch N1, and therefore the output signal of the output port LX is dropped to a low level from the high level.

At time T3, the second control signal $N_{Gate}$ is dropped from the high level to the low level. At this time, the second switch N1 is turned on, and the second gate-to-source capacitor N_Cgs is grounded and discharged. Thus, the charges stored in the second gate-to-source capacitor N_Cgs gradually decreases.

At time T5, the first control signal $P_{Gate}$ is dropped from the high level to the low level. At this time, the first switch P1 is turned on, and the first gate-to-source capacitor P_Cgs is charged by the power voltage source Vcc and accumulates charges therein. Thus, the charges stored in the first gate-to-source capacitor P_Cgs gradually increases. Further, since the first switch P1 is turned on, the output port LX is electrically coupled to the power voltage source Vcc via the first switch P1, and therefore the output signal of the output port LX is the high level signal.

The principle of the switching circuit 100 during time period T5 to T8 is the same to that of T1-T4. Detailed descriptions thereof are omitted.

Further, as shown in FIG. 2, in an operation period of the switching circuit 100, an amount of time when the first switch P1 is turned off (e.g., T1-T4) is greater than an amount of time when the second switch is turned on (e.g., T2-T3). Accordingly, an amount of time when the first switch P1 is turned on (e.g., T4-T5) is less than an amount of time when the second switch is turned off (e.g., T3-T6).

Figure 3:
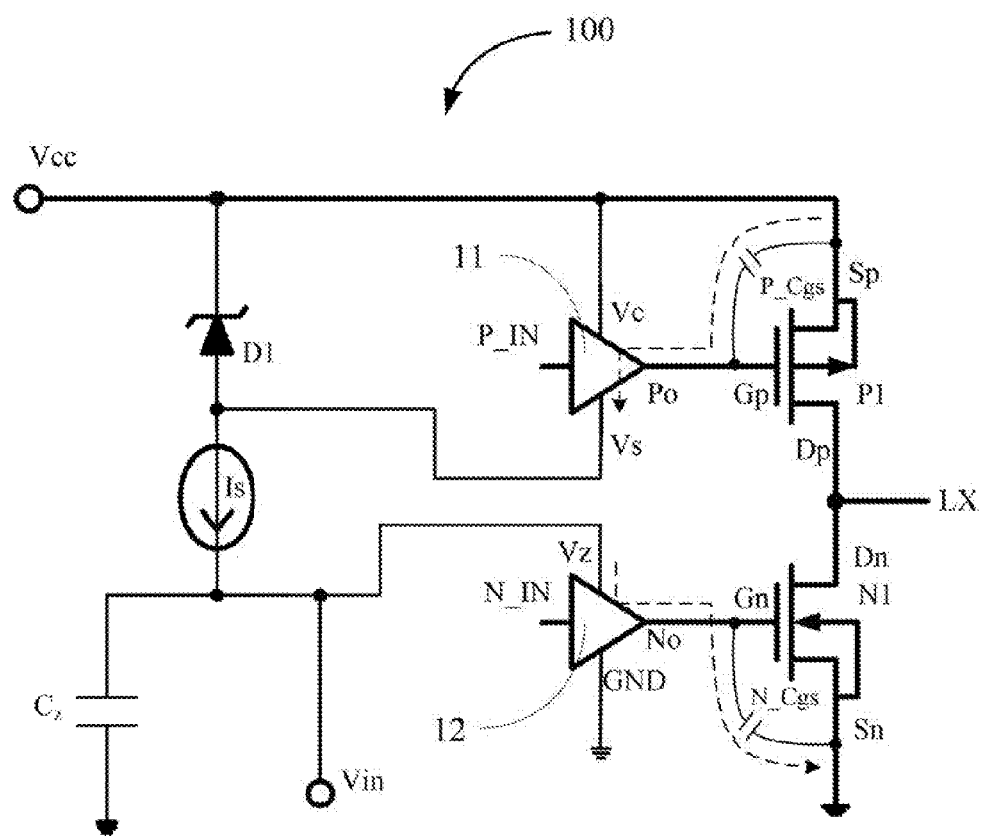
FIG. 3 is a circuit diagram of a switching circuit of the present disclosure according to a second embodiment.

FIG. 3 is a circuit diagram of the switching circuit 100 according to a second embodiment. The second embodiment is similar to the first embodiment, except that the second Diode D2 is omitted. Further, the power terminal Vz of the second pre-driver 12 is electrically coupled to an external power source Vin. Since the output voltage of the current source Is should be limited to a preset threshold voltage, such as 5V, the second pre-driver 12 can be powered by the external power source Vin when the second pre-driver 12 needs a greater driving voltage.

As described above, when the first switch P1 is turned off, the charges stored in the first gate-to-source capacitor P_Cgs can be used to charge the second gate-to-source capacitor N_Cgs. Thus, the total power consumption of the switching circuit 100 can be reduced.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A switching circuit comprising:
    a first switch comprising a first gate, a first source, a first drain, and a first gate-to-source capacitor coupling the first gate and the first source;
    a second switch comprising a second gate, a second source, a second drain, and a second gate-to-source capacitor coupling the second gate and the second source;
    a reservoir capacitor coupled to both the first gate and the second gate; and
    an output port coupled to the first drain and the second drain,
    wherein the first source is coupled to a power voltage source, the first drain is coupled to the second drain, and the second source is grounded;
    the switching circuit configured such that when the first switch is turned on, the first gate-to-source capacitor is charged by the power voltage source;
    the switching circuit further configured such that when the first switch is turned off, the first gate-to-source capacitor discharges, thereby charging the reservoir capacitor.

2. The switching circuit according to claim 1, wherein when the second switch is being turned on, the reservoir capacitor discharges, thereby charging the second gate-to-source capacitor using the charges from the reservoir capacitor.

3. The switching circuit according to claim 2, wherein the first gate is coupled to the reservoir capacitor via a first pre-driver, and the second gate is coupled to the reservoir capacitor via a second pre-driver.

4. The switching circuit according to claim 3, wherein the first pre-driver comprising a first control terminal, a first power terminal, a current source terminal, and a first output terminal; the first control terminal is configured to receive a first control signal configured to control the first switch, the first power terminal is coupled to the power voltage source, the first output terminal is coupled to the first gate of the first switch to transmit the first control signal to the first gate, thereby turning on or turning off the first switch.

5. The switching circuit according to claim 4, further comprising a current source having a first end coupled to the first power terminal of the first pre-driver and a second end coupled to the reservoir capacitor.

6. The switching circuit according to claim 5, wherein the second pre-driver comprising a second control terminal, a second power terminal, a ground terminal, and a second output terminal; the second control terminal is configured to receive a second control signal for controlling the second switch, the second power terminal is coupled to both of the reservoir capacitor and the second end of current source, the second output terminal is coupled to the second gate of the second switch to transmit the external control signal to the second switch, thereby turning on or turning off the second switch.

7. The switching circuit according to claim 6, wherein each of the first pre-driver and the second pre-driver is an integrated circuit for driving the first switch and the second switch, respectively.

8. The switching circuit according to claim 6, wherein the first end of the current source is coupled to the power voltage source via a first diode, the second end of the current source is grounded via a second diode; the first diode comprising an anode coupled to the power voltage source and a cathode coupled to the first end of the current source; the second diode comprising an anode coupled the second end of the current source and a cathode which is grounded.

9. The switching circuit according to claim 8, wherein each of the first diode and the second diode is a zenor diode having a reverse breakdown voltage.

10. The switching circuit according to claim 6, wherein the second power terminal of the second pre-driver is coupled to an external power source.

11. The switching circuit according to claim 1, wherein when one of the first switch and the second switch is turned on, the other of the first switch and the second switch is turned off.

12. The switching circuit according to claim 11, wherein an amount of time when the first switch is turned off is greater than an amount of time when the second switch is turned on in an operation period of the switching circuit.

13. The switching circuit according to claim 12, wherein an amount of time when the first switch is turned on is less than an amount of time when the second switch is turned off in the operation period of the switching circuit.

14. The switching circuit according to claim 1, wherein the first switch is a P type metal oxide semiconductor field effect transistor, and the second switch is an N type metal oxide semiconductor field effect transistor.

* * * * *